United States Patent [19]  
Smith

[11] Patent Number: 4,705,447  
[45] Date of Patent: Nov. 10, 1987

[54] ELECTRONIC TEST HEAD POSITIONER FOR TEST SYSTEMS
[75] Inventor: Nathan R. Smith, Vincentown, N.J.
[73] Assignee: inTEST Corporation, Cherry Hill, N.J.
[21] Appl. No.: 753,684
[22] Filed: Jul. 10, 1985

Related U.S. Application Data

[60] Division of Ser. No. 522,635, Aug. 11, 1983, Pat. No. 4,589,815, which is a continuation-in-part of Ser. No. 411,311, Aug. 25, 1982, Pat. No. 4,527,942.

[51] Int. Cl.$^4$ ............................ B66F 11/00; B25J 1/12
[52] U.S. Cl. ....................................... 414/590; 269/71; 324/158 F; 414/673; 901/48
[58] Field of Search ................ 414/589, 590, 222–225, 414/719, 911, 718, 744 A, 591, 665, 673, 639; 324/158 F; 269/60, 61, 71; 901/14, 17, 48, 50

[56] References Cited
U.S. PATENT DOCUMENTS

| | | | |
|---|---|---|---|
| 2,697,529 | 12/1954 | Hubbell et al. | 901/14 X |
| 3,007,097 | 10/1961 | Shelley et al. | 901/17 X |
| 3,262,593 | 7/1966 | Hainer | 414/751 X |
| 3,665,148 | 5/1972 | Yasenchak et al. | 901/48 X |
| 3,791,052 | 2/1974 | Van Der Lely . | |
| 3,826,383 | 7/1974 | Richter . | |
| 3,873,148 | 3/1975 | Kennicuit . | |
| 4,047,448 | 9/1977 | Pardo et al. | 74/417 |
| 4,062,455 | 12/1977 | Flatau . | |
| 4,076,131 | 2/1978 | Dahlstrom et al. . | |
| 4,132,318 | 1/1979 | Wang et al. . | |
| 4,188,166 | 2/1980 | Moreau et al. . | |
| 4,199,294 | 4/1980 | Streck et al. . | |
| 4,229,136 | 10/1980 | Panissidi | 901/48 X |
| 4,264,266 | 4/1981 | Trechsel . | |
| 4,273,506 | 6/1981 | Thomson et al. | 901/14 X |
| 4,289,441 | 9/1981 | Inaba et al. | 901/17 X |
| 4,299,529 | 11/1981 | Inaba et al. . | |
| 4,303,368 | 12/1981 | Dent et al. . | |
| 4,317,560 | 3/1982 | Troyer | 901/14 X |
| 4,348,142 | 9/1982 | Figour | 901/17 X |
| 4,370,091 | 1/1983 | Gagliardi | 414/735 |
| 4,616,782 | 10/1986 | Marietta et al. | 267/137 X |

FOREIGN PATENT DOCUMENTS 3048045 7/1982 Fed. Rep. of Germany .
2074337 10/1981 United Kingdom .

OTHER PUBLICATIONS

Universal Manipulator #UM 4000 Brochures by Reid Ashman Manufacturing, Inc.
IBM 7535, 7540, 7565 Manufacturing System Brochures.

Primary Examiner—Robert J. Spar
Assistant Examiner—P. McCoy Smith
Attorney, Agent, or Firm—Ratner & Prestia

[57] ABSTRACT

A system for positioning an electronic test head of a test system with respect to an electronic device handler. A positioner assembly moves vertically and provides substantial movement in the horizontal plane with six degrees of freedom. The positioner assembly includes a section for attaching the test head. A counterbalancing assembly is coupled to the positioner assembly to provide a substantially weightless condition to the positioner assembly with the test head attached.

14 Claims, 17 Drawing Figures

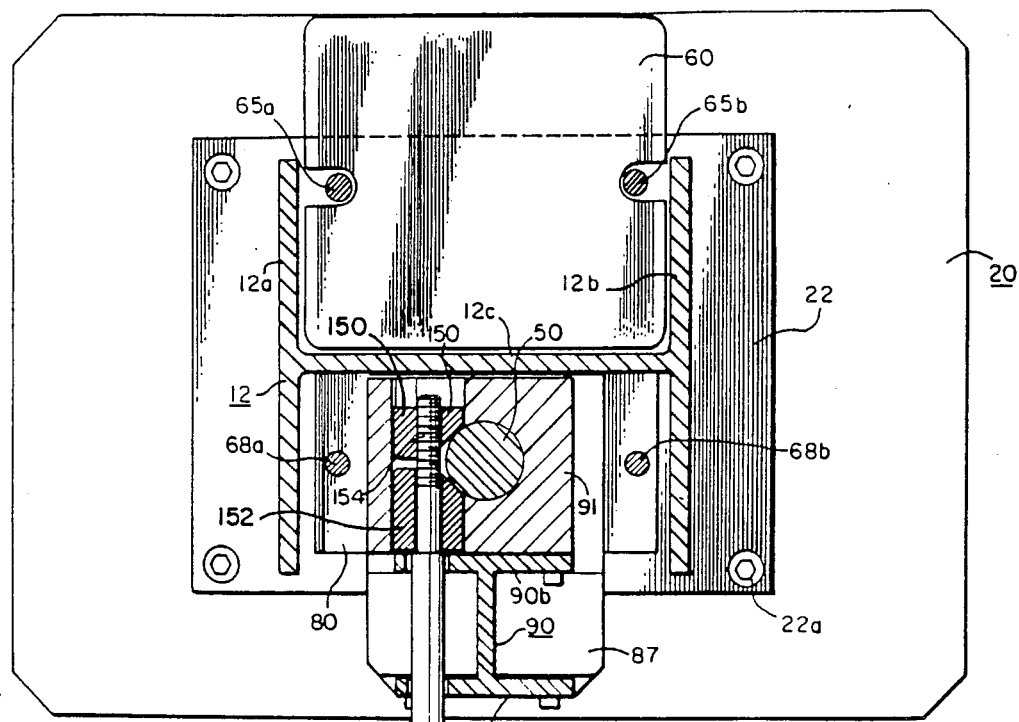
FIG. 4
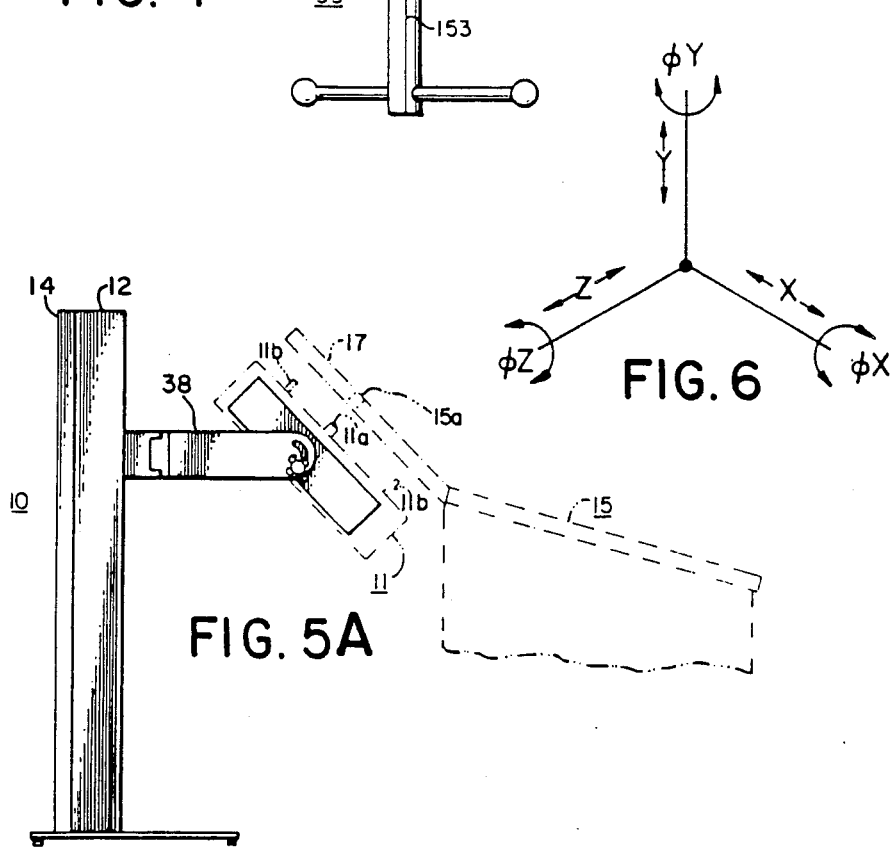
FIG. 5A
FIG. 6

ELECTRONIC TEST HEAD POSITIONER FOR TEST SYSTEMS

This application is a continuation, of application Ser. No. 522,635, filed Aug. 11, 1983, now U.S. Pat. No. 4,589,815.

Which is a continuation-in-part of application Ser. No. 411,311, filed Aug. 25, 1982, now U.S. Pat. No. 4,527,942.

BACKGROUND OF THE INVENTION

A. Field of the Invention

This invention relates to the field of art of electronic test head positioners.

B. Background Art

In the automatic testing of integrated circuits (IC) and other electronic devices, special device handlers have been used which place the device to be tested in position. The electronic testing itself is provided by a large and expensive automatic testing system which includes a test head which has been required to connect to and dock with the device handler. In such testing systems, the test head has been usually very heavy in the order of 75 to 300 pounds. The reason for this heaviness is that the test head uses high speed electronic timing signals so that the electronic circuits must be located as close as possible to the device under test. Accordingly, the test head has been densely packaged with electronic circuits in order to achieve the high speed testing of the sophisticated devices.

The prior art has left much to be desired in providing a manipulator or positioner to easily move the heavy test head accurately into position with respect to the device handler mechanism. In some prior positioners the test head has been positioned by means of lead screws and rotating and sliding mechanisms each movable one at a time. These prior systems left much to be desired in that they did not provide all of the degrees of freedom necessary for easy and accurate docking with the handler. The user has had to move the heavy device handler or the heavy positioner itself in order to provide alignment. Other prior art manipulating systems have used motors to drive the lead screws in the up/down direction. Such a motor driven lead screw or even a hand driven one provides the possibility of damaging either the test head socket connections or the connections which are on the device handler due to overstressing.

Another disadvantage of the prior art systems is that they are large and take up a considerable amount of floor space which is at a premium in test facilities. A further difficulty of large prior systems has involved the cable which connects the test system to the test head which is usually short, cumbersome and fragile. Accordingly as a result of their size and construction, prior systems could not be moved sufficiently close to the test system.

For purposes of considering patentability, a brief patentability search was conducted. The patents identified to be of possible interest in the search were:

| Patent No. | Inventor |
| --- | --- |
| 4,199,294 | Streck et al. |
| 4,062,455 | Carl Flatau |
| 4,132,318 | Wang et al. |
| 3,873,148 | Robert Kennicuit |

| Patent No. | Inventor |
| --- | --- |
| 4,076,131 | Dahlstrom et al. |
| 4,188,166 | Moreau et al. |
| 4,273,506 | Thomson et al. |
| 4,299,529 | Inaba et al. |
| 4,264,266 | Hans Trechsel |
| 3,791,052 | Cornelis Van Der Lely |
| 3,826,383 | Hans Richter |
| 4,303,368 | Dent et al. |

Accordingly, an object of the present invention is an electronic test head positioner that has six degrees of freedom and provides a substantially weightless condition to the test head which may be manipulated by hand for easy and accurate docking and undocking of the test head with the device handler.

Another object of the invention is an electronic test head positioner formed by a column rising vertically from a base which takes little room on the floor with respect to the test system.

SUMMARY OF THE INVENTION

A system for positioning an electronic test head with respect to an electronic device handler which comprises a housing including shaft means. A positioner assembly has vertical movement along the shaft means and provides substantial movement in the horizontal plane with six degrees of freedom. The positioner assembly includes means for attaching the test head. Counterbalancing means is coupled to the positioner to provide a substantially weightless condition to the position assembly with the test head attached.

BRIEF DESCRIPTION OF THE DRAWINGS

FIG. 4 is an elevational sectional view of FIG. 3;

FIG. 5A is a diagrammatic view of the system of FIGS. 1-3 showing the docking of a test head with a mechanism plate of a handler;

FIG. 6 diagrammatically shows the six degrees of freedom of the system of FIGS. 1-3;

DESCRIPTION OF THE PREFERRED EMBODIMENT

Figure 1:
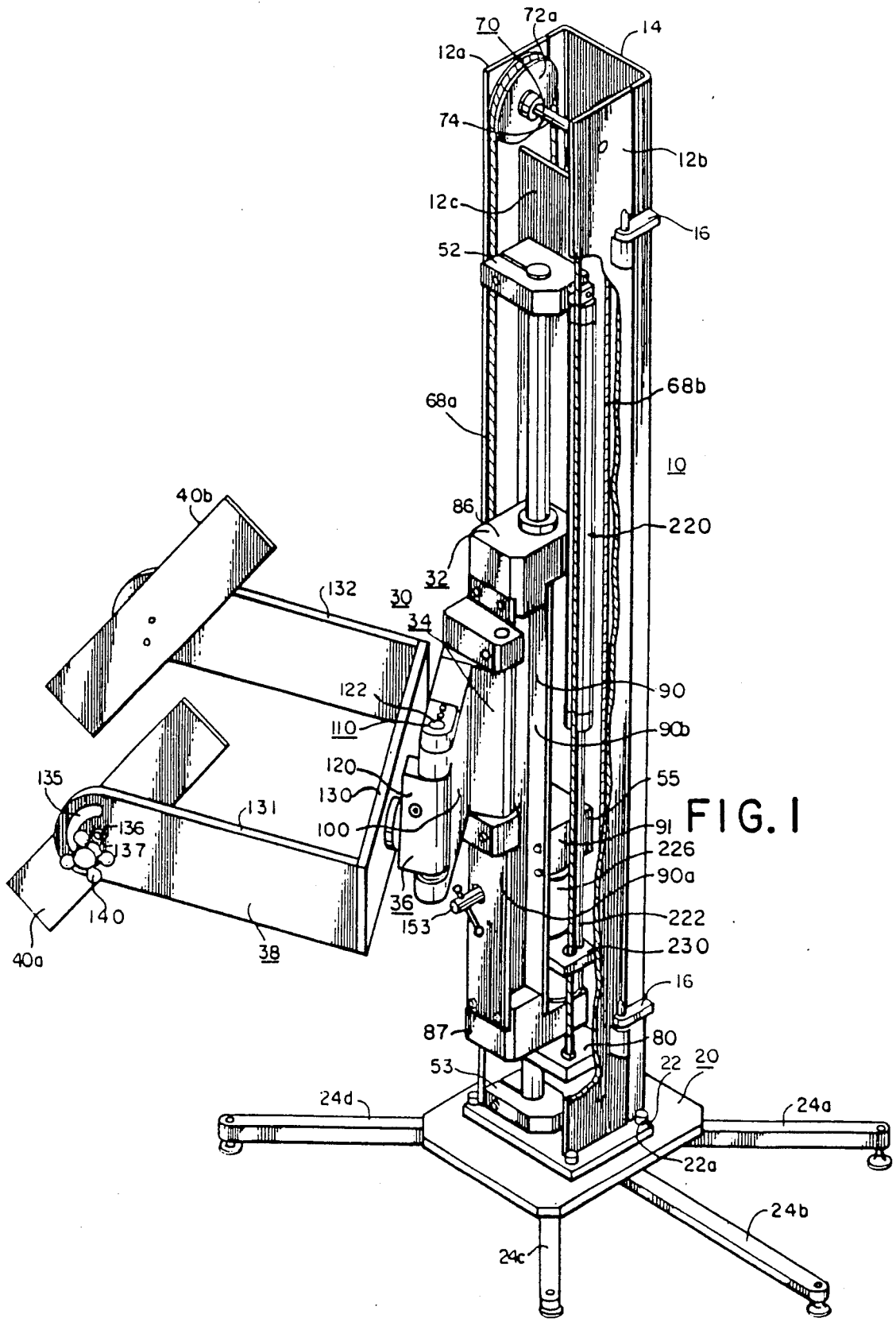
FIGS. 1-3 are perspective view of a test head positioner system in accordance with the present invention.

Referring now to FIG. 5A, there is shown a test head positioner system 10 in accordance with the invention. As shown, positioner system 10 carries a test head 11 for a test system for docking with a mechanism plate 17 of an integrated circuit handler 15. It will be understood that other electronic devices may be handled by device handler such as transistors, chips or dies, etc. In operation, positioner system 10 is moved manually in a substantially weightless condition to manipulate the heavy test head 11 accurately and precisely and dock it into the mechanism plate 17. In docking, location pins 11b are inserted into corresponding openings in plate 17 and test connector 11a enters and mates with a connector for a device 15a to be tested. The position of test head 11 may be accurately manipulated in a substantially weightless condition to another position with six degrees of freedom substantially extensible in the horizontal plane to dock with other mechanism plates in any position. For example, mechanism plates for probers or handlers may be anywhere from a horizontal plane to a vertical plane.

Figure 2:
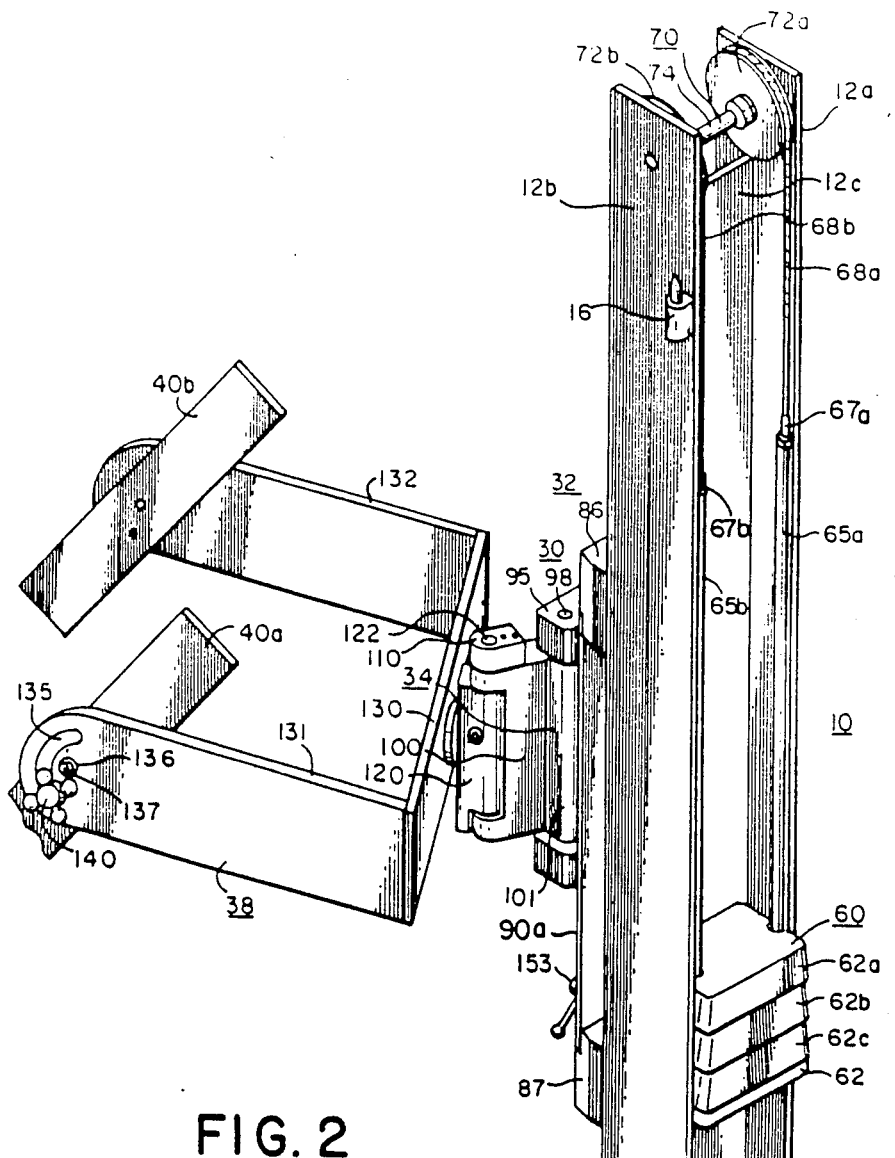
Figure 3:
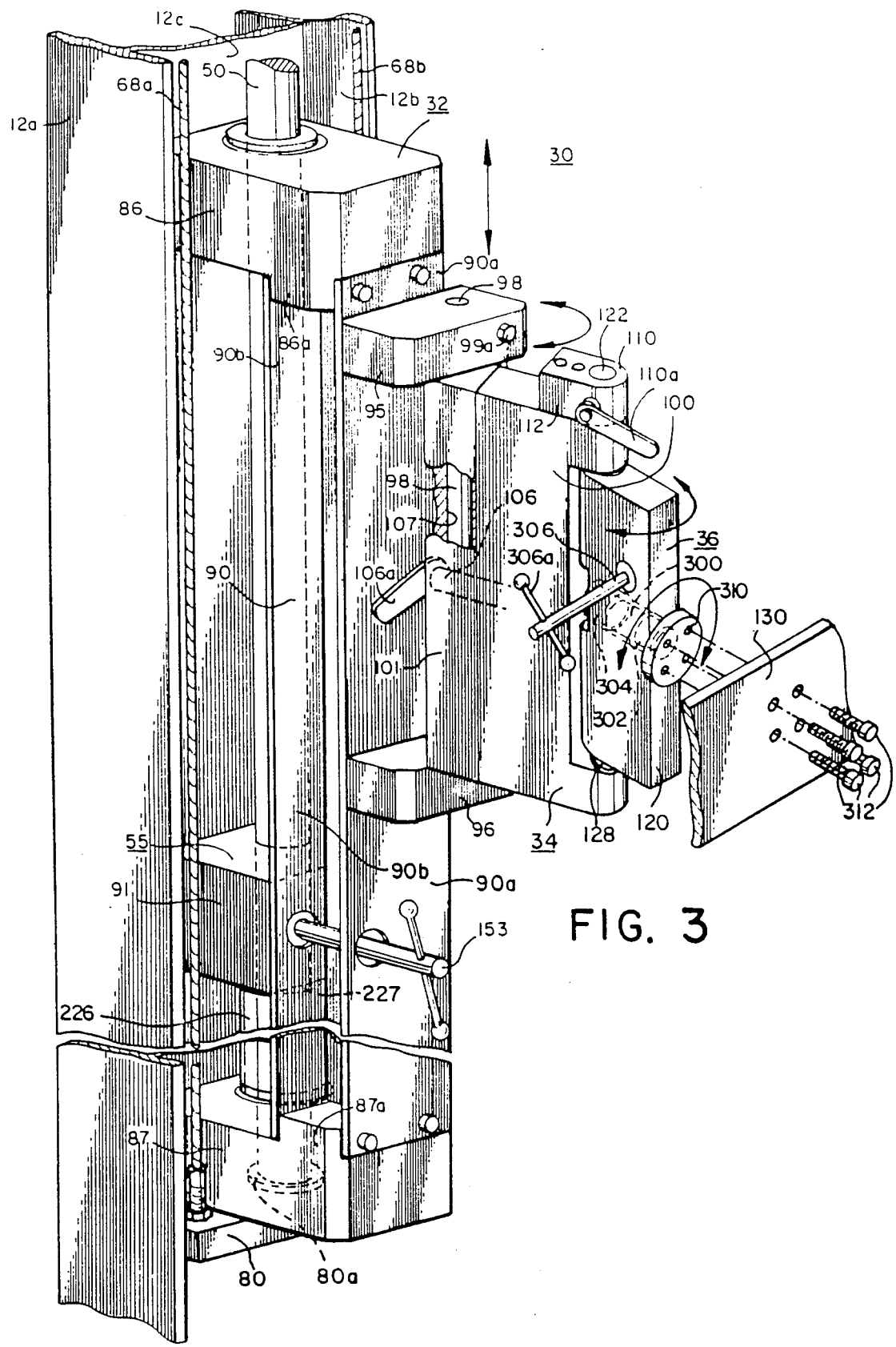

The details of system 10 are shown in FIGS. 1-3 in which an H-shaped beam forms a vertical column 12. Column 12 has opposing walls 12a,b with a flange 12c connecting the two walls together. Column 12 is supported at its bottom by a base assembly 20 having a base plate 22 and outwardly extending legs 24a-e. Column 12 is secured to plate 22 by bolts 22a for example. The rear of column 12 is closed by a U-shaped door 14 hinged to wall 12b by way of hinges 16.

Test head 11 is supported and manipulated in its docking by a positioner arm assembly 30 which moves vertically on a main shaft 50. Assembly 30 comprises a main arm assembly 32, a forearm assembly 34, a wrist joint assembly 36, a cradle assembly 38 and test head adapter plates 40a,b. Main shaft 50 is secured by opposing pillow blocks 52,53.

Positioner arm assembly 30 is counterbalanced to ride vertically on main shaft 50 by a counter weight assembly 60 having a weight carriage 62 which moves vertically in either direction within the rear section of column 12. Carriage 62 has vertically extending carriage shafts 65a,b secured thereto and carries removable weights 62a-c. Weights 62a-c exactly counterbalance the weight of assembly 30 and test head 11 so that they are substantially weightless.

The upper ends of shafts 65a,b threadedly receive members 67a,b swaged to respective ends of cables 68a,b received within grooves of pulleys 72a,b of assembly 70. Shaft 74 permits the rotation of pulleys 72a,b and the shaft is received at an upper end section of column 12. Cables 68a,b extend downwardly along the inner surface of walls 12a,b through openings in a plate 230 and are securely fastened by way of swaged members to a lift block 80 positioned under main arm assembly 32. Block 80 has an opening for receiving shaft 50 and the block slides along web 12c and is thus prevented from rotating around shaft 50.

Figure 8:
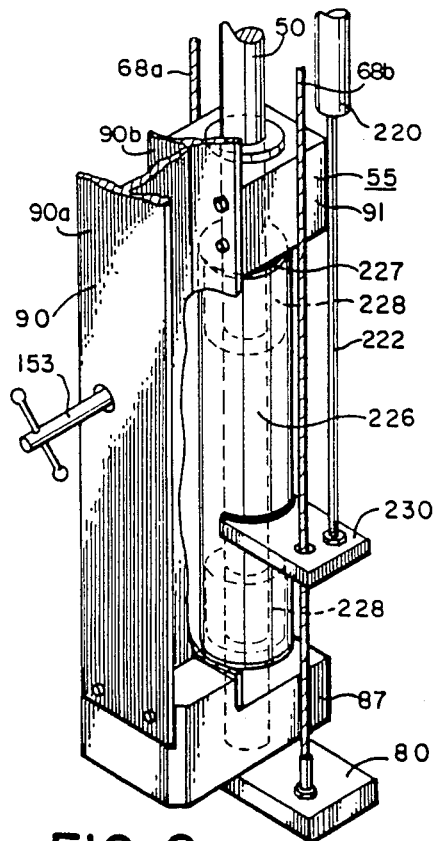
FIG. 8 is a perspective cut away view of a portion of FIG. 3.

As shown in FIGS. 3, 8, main arm assembly 32 includes an upper bearing block 86 and a lower bearing block 87 carried by block 80. A main shaft thrust bearing 80a is provided between blocks 80, 87. Blocks 86, 87 have respective lower extending and upper extending sections 86a, 87a and as shown engage an I beam 90. Specifically, a front wall 90a of I beam 90 is secured to front faces of blocks 86, 87 while a rear section 90b of I beam 90 is secured to sections 86a, 87a. The vertical and rotational movements of assembly 32 may be temporarily locked in any position by means of a lock 55 formed in a block 91 as later described in detail. A sleeve 226 concentric with shaft 50 is secured between blocks 87, 91 having inner linear bearings 228 which permit the sleeve to travel upwardly and downwardly on shaft 50. Further, sleeve 226 has thrust bearings 227. In this way a unitary main arm assembly 32 is formed which is adapted to have vertical movement and rotational movement (about a vertical axis) on a vertical shaft 50.

To provide velocity sensitive viscous damping for assembly 32, a fluid cylinder 220 has one end fixed to pillow block 52 and the other end to plate 230 secured to the outer surface of sleeve 226. Cylinder 220 prevents rapid vertical movement of arm assembly 30 as a safety feature for operating personnel and to prevent damage to the handler and test head. Cylinder 220 may be a Bimba model 0920-DP, Bimba Manufacturing Co., Monea, Ill.

Secured to front face 90a are a pair of pillow blocks 95, 96 of forearm assembly 34. A vertical shaft 98 extends through pillow blocks 95, 96. Forearm assembly 34 further includes a forearm 100 having a rear section 101 which is bolted to forearm 100 by means of bolts. Shaft 98 extends through vertical opening 107 in section 101 with needle bearings at either end and a thrust bearing between section 101 and pillow block 96. Forearm assembly 34 may be temporarily fixed in its rotational position about a vertical axis by means of a forearm lock assembly 106.

It will be understood that forearm assembly 34 may be effectively turned 180° while maintaining all the other elements in their original positions. In this manner, rear section 101 extends to the left as compared to the right as shown in FIG. 3.

Forearm 100 has a front "C" shaped section which rotatively receives an attachment member 120 of wrist joint assembly 36. Member 120 rotates with respect to forearm 100 by way of vertical upper and lower pivot pins 122. Needle bearings are provided for the rotation of pins 122 in forearm 100 and a thrust bearing 128 is provided between member 120 and forearm 100. Member 120 may be temporarily prevented from rotation with respect to assembly 34 by means of a wrist joint lock assembly 110 which is formed within a block 112 secured to the upper surface of forearm 100.

Member 120 has a longitudinal opening for receiving a horizontally extending shaft 300 which is rotated within needle bearings 302 and 304 secured to member 120. Shaft 300 at its outer end is welded to a connecting hub 310 for threadedly receiving cap screws 312 to rigidly secure back plate 130 of cradle assembly 38.

Cradle assembly 38 is formed by three walls 130–132 welded together to form a U-shaped holder for the test head. Shaft 300 is effective to allow the rotation of assembly 38 about a horizontal axis and assembly 38 may be secured in position by tightening of cradle lock assembly 306 which is similar to assembly 55.

Walls 131, 132 receive test head adapter plates 40a,b and allow these plates to rotate with respect to the walls and then to be rigidly fixed in position. Since the structure of both plates 40a,b are the same only one of them need be described. Arm 131 has within an end section a circular groove 135 and an opening 136 for receiving a shoulder screw 137. A lock knob 140 is threaded into plate 40a and moves about circular groove 135 in conventional manner. In this way, by tightening lock knob 140, plate 40a is rigidly secured with respect to wall 131.

It will now be understood that test head positioner system 10 simultaneously positions in six degrees of freedom, X, Y, Z, $\theta_X$, $\theta_Y$, $\theta_Z$. As shown in FIG. 6, it is important for the proper docking of test head 11 that the test connector 11a have that six degrees of freedom so that it can accurately and effortlessly be positioned with respect to the device to be tested, 15a for example.

If the Y direction were considered to be the vertical or up/down direction then the movement of assembly 32 vertically with respect to shaft 50 provides the Y direction of freedom. $\theta_Y$ freedom, which is the rotation about the Y axis is then provided by simultaneous rotation of all of the joints about vertical axes 50, 98 and 122.

If the X direction were considered to the left to right direction, then that freedom is provided by pivots 50, 98 and 122 in the same manner as $\theta_Y$. The $\theta_X$ freedom is provided by shoulder screw pivot 137. With respect to Z movement which may be considered to be the in and out movement, such freedom is provided by pivot shafts 50, 98 and 122 in the same way as $\theta_Y$, $\theta_Z$ is then provided by the pivoting of shaft 300.

Referring now to FIG. 4, there is shown a main arm assembly lock 55 which comprises a conventional wedge lock system. Specifically, two wedges 150 and 152 are provided on either side of shaft 50 and are threadedly engaged by threads 154 of a lock handle 153. By turning lock handle 153 clockwise, wedge members 150, 152 are brought together and apply pressure onto shaft 50 and this way prevent rotation of block 91 about shaft 50 and also prevent a vertical movement of block 91 and the entire assembly 30. Similar lock assemblies are provided for forearm lock assembly 106, wrist joint lock assembly 110 and cradle lock assembly 306 which have turning arms 106a, 110a, 306a respectively.

Figure 5B:
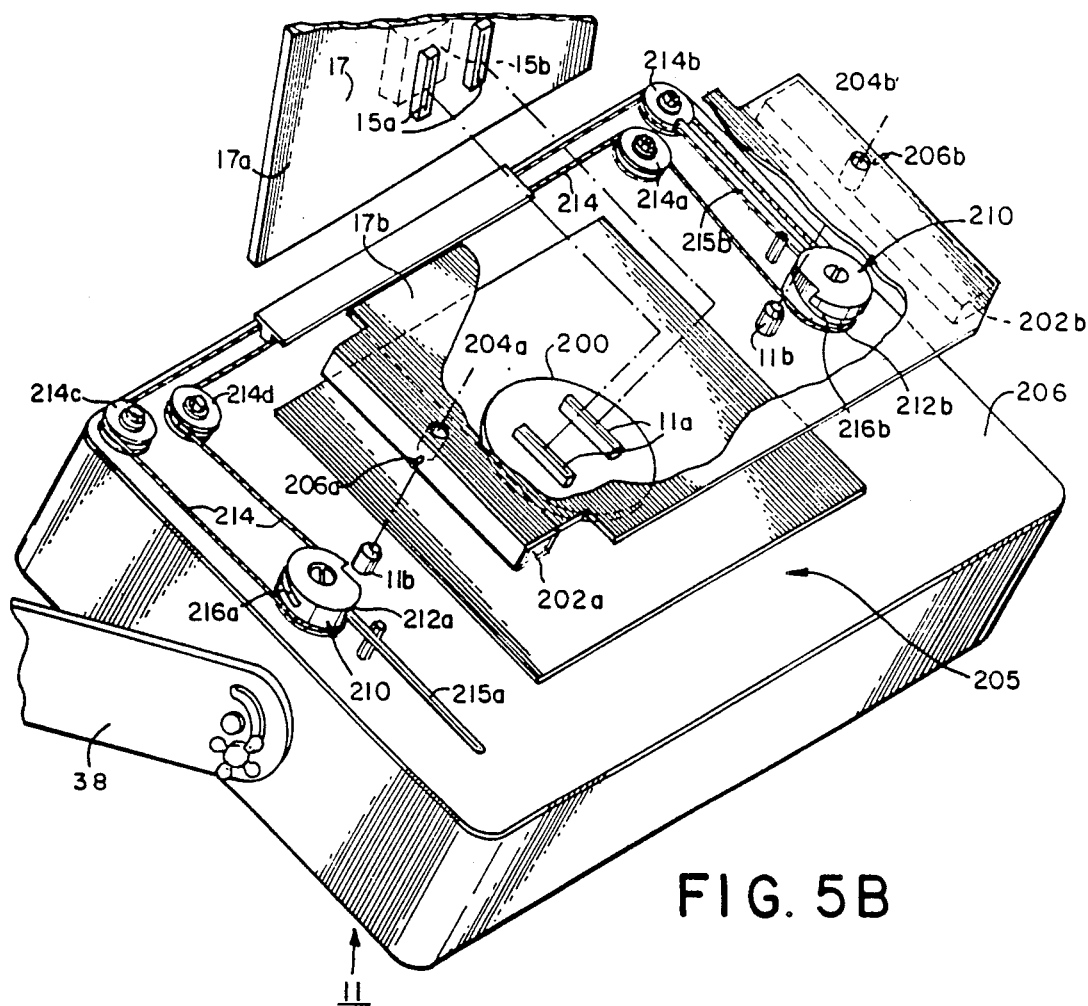
FIGS. 5B-C is a perspective view and an elevational sectional view of the detailed structure of the mechanism plate and test head.
Figure 5C:
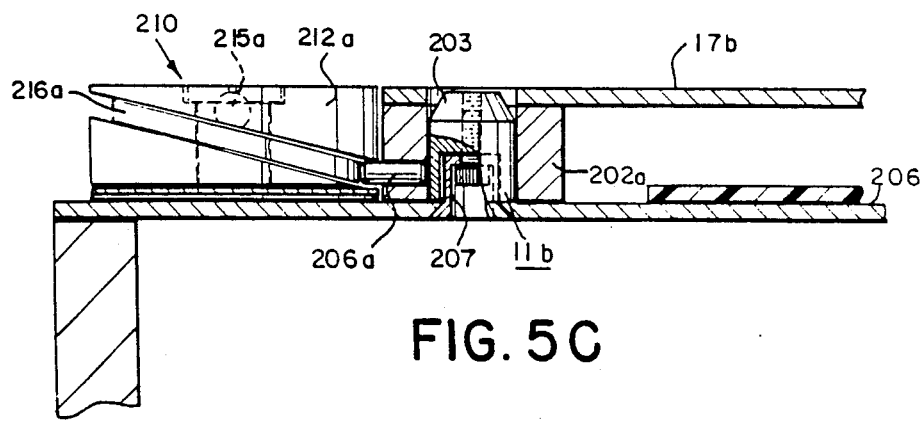

Referring now to FIGS. 5B,C, there is shown the details of mechanism plate 17 and test head 11. Specifically, mechanism 17 comprises a handler back plate 17a and a docking gusset assembly 17b. Plate 17a carries a device 15a to be tested which is electrically connected through movable contacts to male connectors 15b fixed to the back plane of plate 17a. Assembly 17b has an opening 200 to allow access to connectors 15b and effectively provides the back plane with gussets or blocks 202a,b by bolting assembly 17 to the back plane of plate 17a. It will be understood that similar gussets may, in a further embodiment, be mounted directly to the back plane.

Each of gussets 202a,b has a centrally located guide opening 204a,b and are adapted to receive guide or location pins 11b of test head 11. Specifically, test head 11 has a docking assembly 205 and test connectors 11a which are mounted on a test head face plate 206. Guide pins 11b are effective to accurately locate connectors 11a with handler connectors 15b.

It will be understood that connectors 11a, 15b are very fragile and must be mated with great accuracy to avoid damage. This is particularly a problem in view of the weight and mass of test head 15. Accordingly, guide pins 11b and blocks 202a,b are effective to keep the connectors 11a, 15b separated from each other until the pins 11b are actually received in guide openings 204a,b which ensures alignment and positive precise connection of connectors 11a, 15b. When pins 11b are aligned in the openings, it is then necessary to pull connectors 11a, 15b together. This is accomplished by means of a cam assembly 210 mounted on plate 206 which receives cam follower pins 206a,b which extend outwardly from blocks 202a,b. Assembly 210 comprises a pair of cylindrical cams 212a,b journaled at their centers to fixed pivots and which synchronously operate by way of an endless cable 214. Each of the cams has a lower groove for receiving cable 214 which is tautly coupled between the cams by way of pulleys 214a–d, as shown. Each cam 212a,b has an outwardly extending handle 215a,b so that rotation of either handles operates both cams in synchronism with a mechanical advantage of, for example, 5:1.

Each cam 212a,b has a side helical groove 216a,b with an upper cut-out on the upper face for respectively receiving pins 206a,b when pins 11b are in openings 204a,b. Upon turning of one of the handles 215a,b the cams operate in synchronism to pull test head 11 into the plane of handler mechanism plate 17, thereby bringing both connectors 11a, 15b together into mating relationship. After mating, many devices 15a may then be tested by the handler system. In order to change test configurations, it is then necessary to disconnect connectors 11a, 15b and then remove the handler from the test head. Accordingly, one of the handles is operated to pull plate 17a from plate 206 thereby disconnecting connector 11a from 15b.

In this manner, by rotary motion to cam assembly 210 there is produced linear motion between plates 17a, 206 for the required docking and undocking force.

Each of the guide pins 11b is calibratable and includes an outer pin housing 203 having an inner chamber which receives a guide pin mount 207 having an outer diameter substantially less than the inner diameter of the chamber. Mount 207 has an inner chamber for receiving a cap screw 209 which extends through an opening which provides substantial clearance. Thus screw 209 may be loosened so that housing 203 may be precisely aligned on plate 206.

Figure 7A:
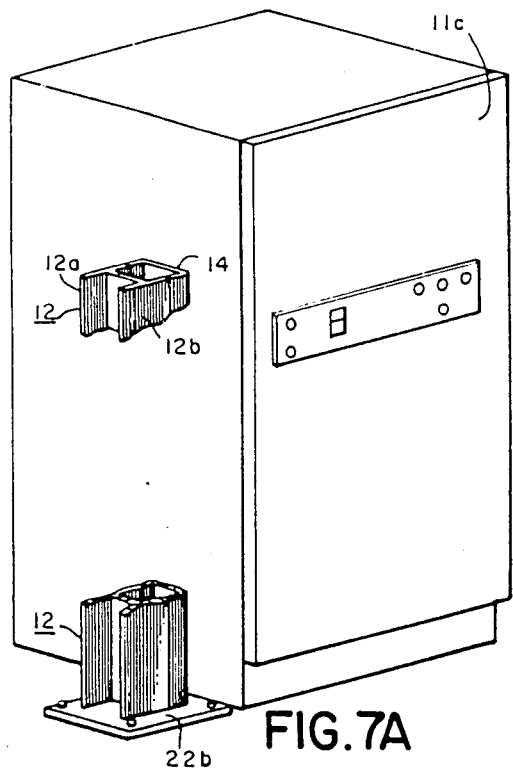
FIGS. 7A-D show further embodiments of the invention with respect to securing the positioner system alongside the test system.
Figure 7B:
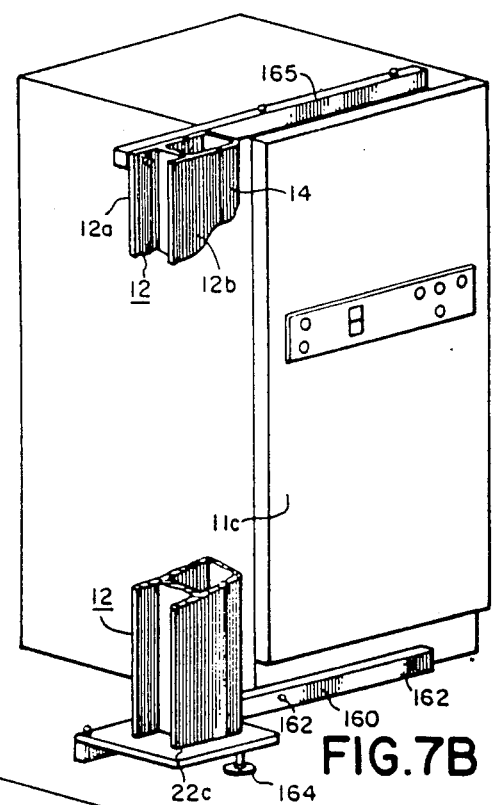
Figure 7C:
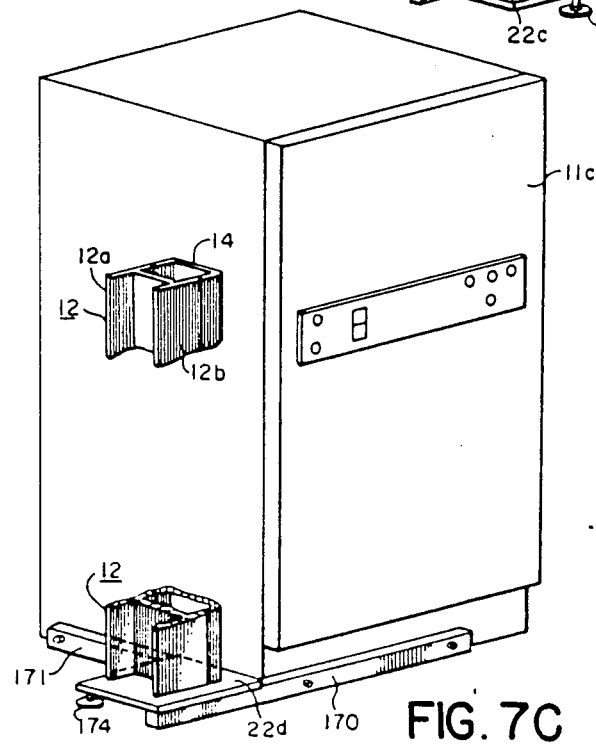
Figure 7D:
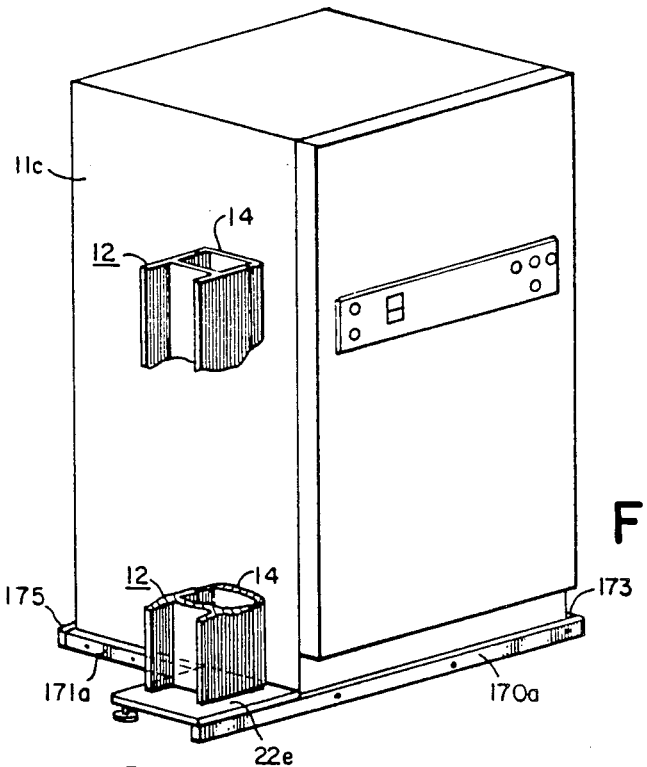

Referring to FIG. 7A there is shown base 22b which is directly bolted onto the floor immediately next to test cabinet 11c of the test system. In still another embodiment shown in FIG. 7B a base 22c has attached to its lower surface along one side a rigid horizontal bar or leg 160. Mounting bolts 162 are used to secure bar 160 to the bottom of cabinet 11c. A leveling pad 164 remote from bar 160 provides leveling. A further strut 165 is secured to cabinet 11c and to wall 12a of column 12. In this manner, column 12 is secured close to cabinet 11c so that system 10 is as close as possible to the test system. In the embodiment of FIG. 7C, a base 22d has connected to its lower surface perpendicular legs 170, 171 coupled to adjacent sidewalls of test cabinet 11c. A leveling pad 174 is provided. Instead of being bolted to cabinet 11c, bars 170, 171 may be extended to the ends of the cabinet as shown in FIG. 7D as bars 170a, 171a. These bars are bolted to each other and also bolted to two additional bars 173, 175 which secure the remaining two sides of the cabinet. In this way, the four bars 170a, 171a, 173 and 175 are bolted to each other to rigidly engage cabinet 11c to base 22e.

Figure 9:
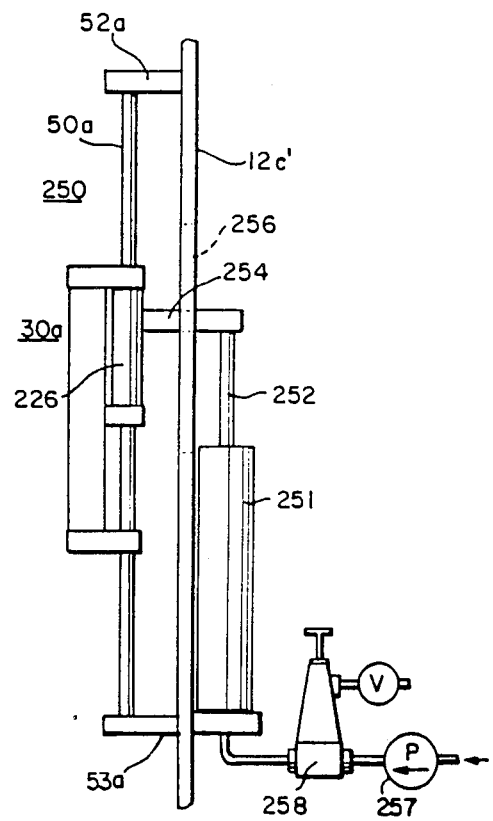
FIG. 9 is another embodiment of the present invention in which a pressurized cylinder is used.

Still another embodiment of the invention is shown in FIG. 9 in which system 250 replaces the weights and cable assembly 60, 68a,b of system 10 with a pressurized cylinder 251 having a piston 252. Cylinder 251 effectively provides the same function as counterbalance assembly 60 in that it produces a constant force on arm assembly 30a (including test head 11) counter to gravity regardless of the actual position of the assembly. The balancing of different weights of assembly 30a may be accomplished by maintaining a constant pressure within the cylinder 251 by means of a regulator 258 supplied by pump 257 and described in detail with respect to FIGS. 10, 11.

Cylinder 251 is rigidly secured to central web 12c' of column 12 of FIG. 1. Piston 252 extends upwardly and is fixedly connected to a horizontal arm 254 which extends through a slot 256 formed in web 12c'. At its other end, arm 254 is fixedly welded to sleeve 226, FIGS. 1, 8. In all other respects, system 250 is substantially similar to system 10.

Figure 10:
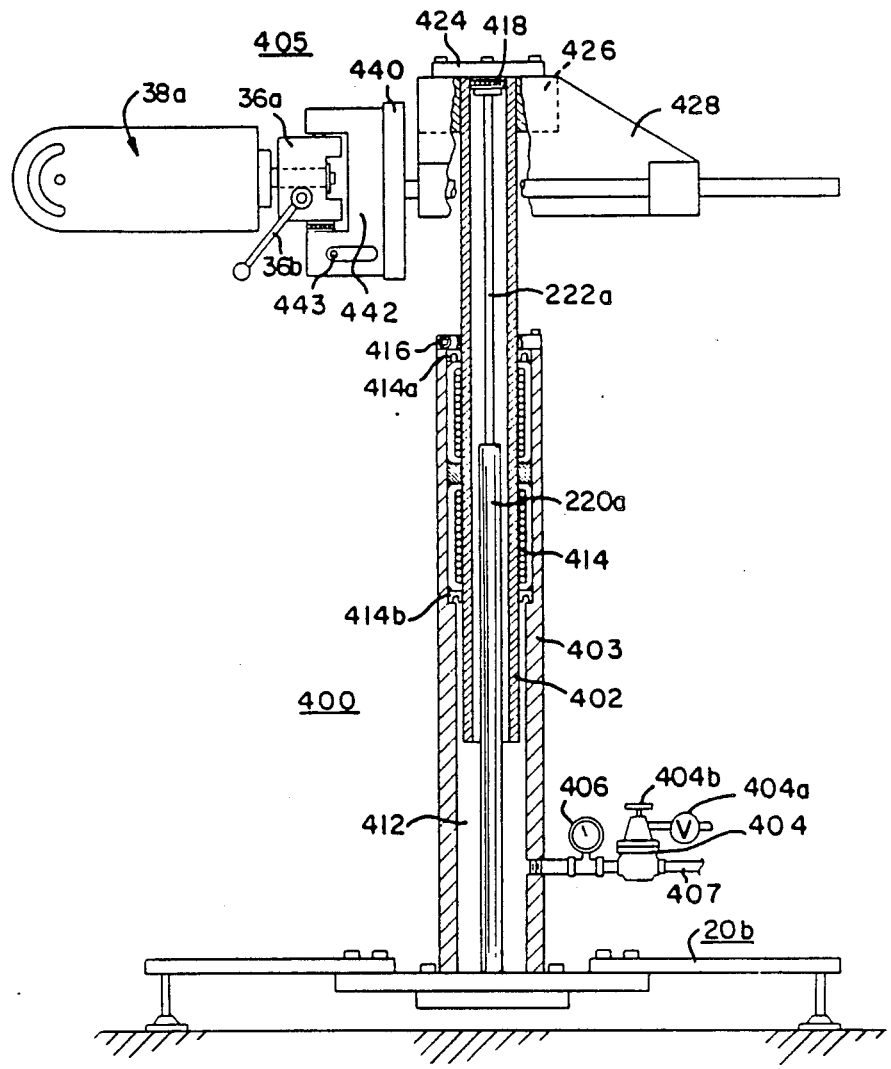
FIGS. 10 and 11 are perspective views of a further embodiment in which the vertical column of FIGS. 1-3 is replaced by a vertical cylindrical support tube.
Figure 11:
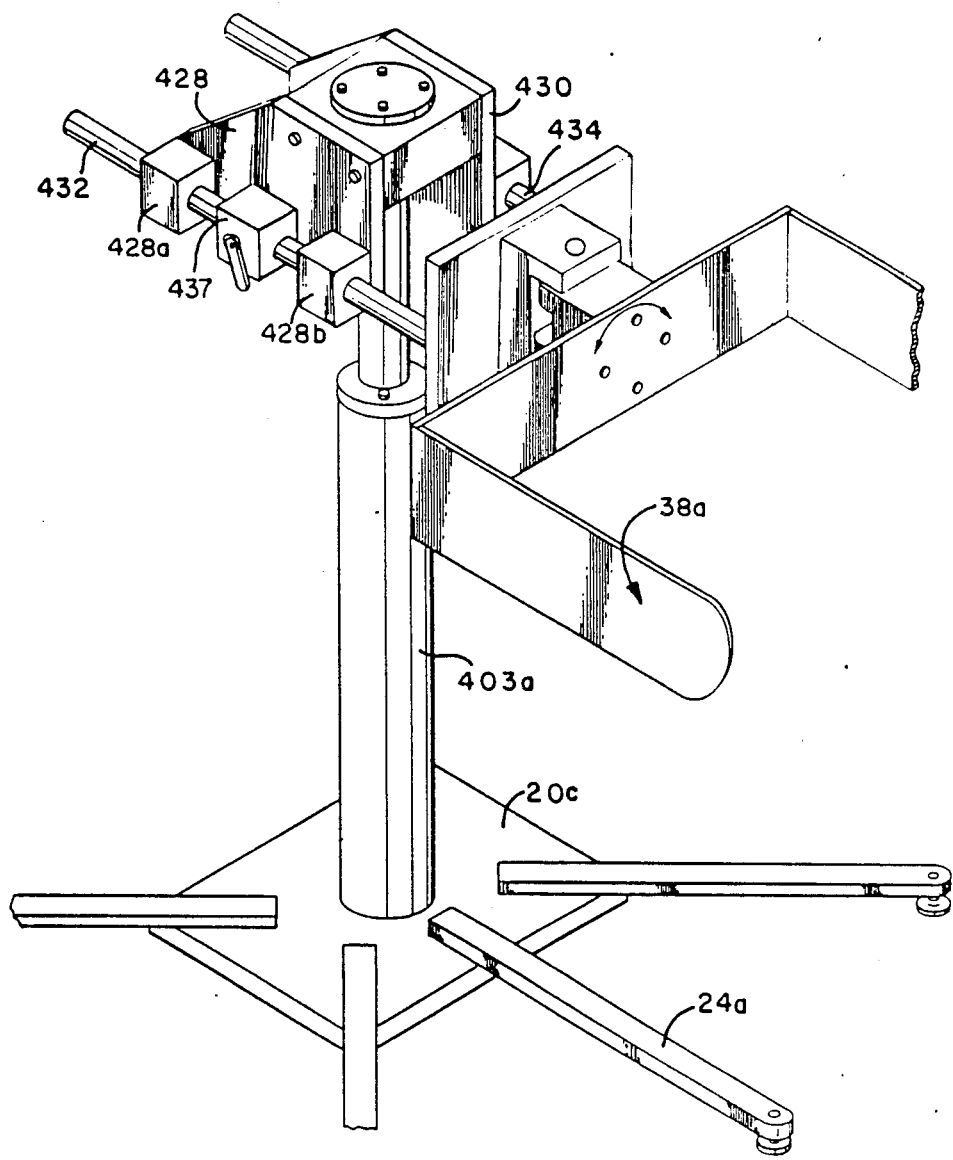

Referring now to FIGS. 10–11, there is shown a further embodiment in which vertical column 12 of system 10 is in system 400 replaced by a vertically displaced cylindrical support tube 403. Tube 403 forms a cylinder for a piston and telescoping rod 402 with seals 414a,b. As in systems 10 and 250, support tube 403 is supported at its bottom by a base assembly 20b having extending legs 24a–e. Tube 403 and piston 402 operate the same as tube 251 and piston 252.

Specifically, a fluid cavity 412 is formed between the piston and cylinder. Fluid under pressure flows into and out of the cavity from a fluid source coupled by way of a line 407 through a regulator 404, an pressure gauge 406 to cavity 412. In conventional manner, regulator 404 has an opening to atmosphere 404a which allows pressure from cavity 412 to be released when it is in excess of the regulator setting 404b. In a preferred example, the fluid is air under a pressure of 25–100 pounds per square inch. This would accommodate a total weight of arm assembly 405 including a test head where the test head weighs from 75–300 pounds. In this manner there is achieved a constant pressure "gas spring" so that positioner arm assembly 405 effectively achieves weightlessness. When it is desired to manually move the position of assembly 405 either up or down, the fluid volume in cavity 412 changes which is immediately compensated for by pressure regulator 404. Preferably, assembly 405 may have a 15–20 inch travel.

Within piston 402 there is disposed a damper 220a having a damper rod 222a which is similar to that shown in FIGS. 1 and 8. The top end of damper 220a is journaled in a bearing 418 connected to an upper plate 424 of arm assembly 405. In this manner, damper 220a is effective to damp the movement of assembly 405 while the rotation of the assembly does not adversely twist rod 222a.

Assembly 405 is similar to assembly 30 but has been designed for further simplicity. Specifically, rotation and vertical movement of rod 402 may be locked by a lock assembly 416, as shown. The upper section of piston 402 is rigidly secured to mount block 426 to which is secured bearing mount plates 428, 430. Plate 428 has secured to its outer face bearing blocks 428a,b and similarly plate 430 has blocks 430a,b. These blocks have linear bearings for receiving horizontal shafts 432, 434 respectively. Locking block 437 secured to plate 428 is effective to receive shaft 432 and prevent movement thereof when locked. Shafts 432, 434 are rigidly connected at their left end to a wrist mounting plate 440 which fixedly carries a wrist bearing block 442 having a lock assembly 443 similar to assembly 110. Block 442 has secured to an inner section thereof a wrist joint assembly 36a carrying a cradle assembly 38a which are similar to assemblies 36, 38 of system 10.

In operation, as in system 10, all of the locks of positioner system 400 are open and then the cradle assembly 38a is moved to its desired positioner. That is, assembly 405 may turn about cylinder 403 as well as horizontally by way of shafts 432, 434 and then to other positions determined by assemblies 442, 36a and 38a. It will be understood that shafts 432,434, by providing horizontal movement, eliminates the need for forearm shaft 98 while still providing the above described six degrees of freedom. When the desired position is achieved, then the respective locks 416, 437, 443, 306b and the locks of cradle 38a are actuated to maintain the desired position.

Figure 12:
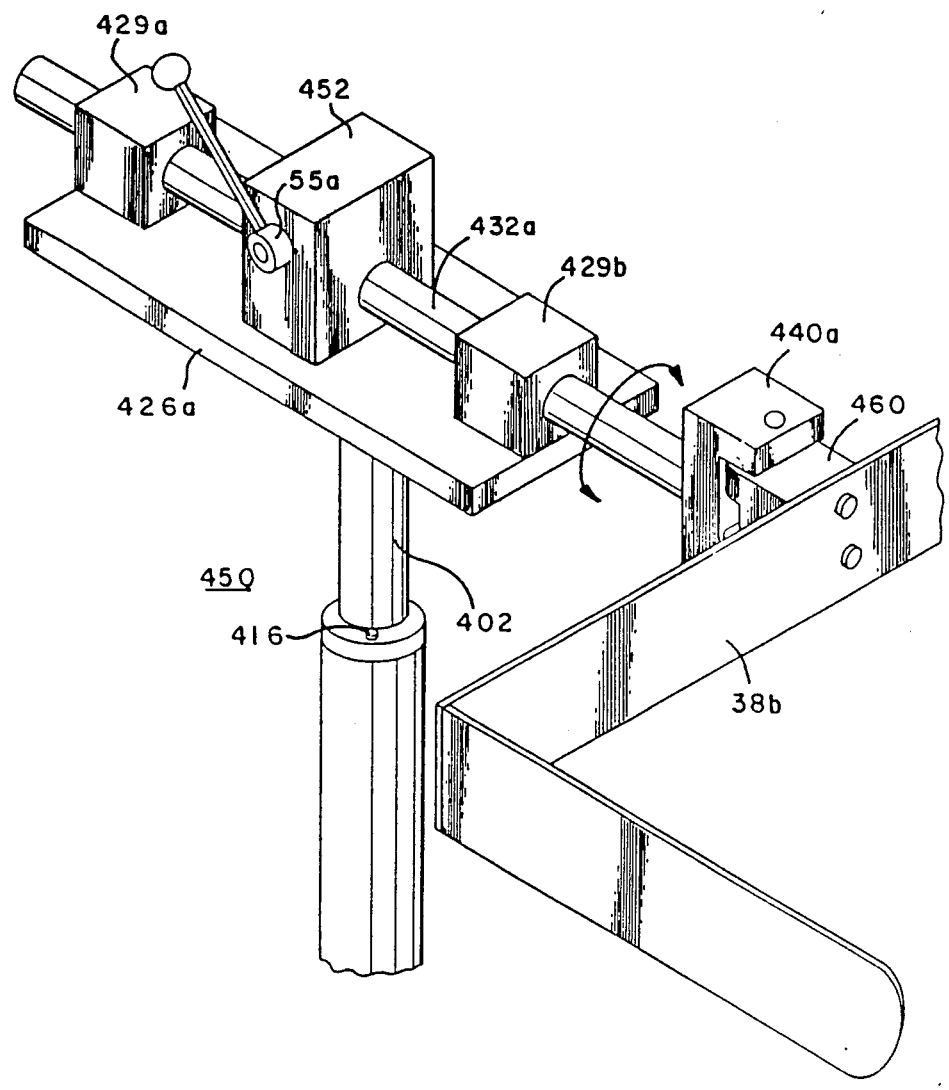
FIG. 12 is a perspective view of still another embodiment having a vertical tube of FIGS. 10,11.

A modification of positioner system 400 is shown in FIG. 12 as positioner system 450. Positioner system 450 is suitable for relatively lightweight test heads since it is a simplified construction having a single shaft 432a horizontally journaled in blocks 429a,b and 452. Blocks 429a,b and 452 are carried by and secured to a mount block 426a which is supported by piston 402. The horizontal and rotational movement of the shaft 432a is locked by previously described wedge lock system 55a within block 452. Further, the end of shaft 432a is rigidly secured to a wrist bearing block 440a. Block 440a supports a simplified wrist joint assembly 460 which carries cradle assembly 38b. Suitable locks are provided in blocks 440a, 460 and assembly 38b in the manner previously described.

What is claimed is:

1. A system for maintaining an object in a substantially weightless condition without the effect of gravity comprising:

support means having a first continuously vertical axis;

positioner means coupled to the support means and having a vertical movement with respect to the support means and movement in a horizontal plane, the positioner means including cradle means for attaching the object;

counterbalancing means coupled to the positioner means to provide a substantially weightless condition to the positioner means with the object attached whereby said positioner means is free to manually move vertically from a predetermined lowermost to a predetermined uppermost position free of mechanical restraints between the two positions; and the positioner means including continuously horizontal linear motion guide means for providing horizontal movement of the object with respect to the support means, the positioner means including a second continuously vertical axis, means for pivotally mounting the object about the second continuously vertical axis, at least one of said continuously vertical axes being free to rotate as the positioner means is manually extended, the positioner means having an additional continuously horizontal axis for providing rotation of the object about said additional continuously horizontal axis whereby as the object is extended in the horizontal plane and rotated, the two vertical axes, the horizontal linear motion guide means, and the additional horizontal axis themselves support the weight of the positioner means with the cradle means and the attached object without the effect of gravity.

2. A system for maintaining an object in a substantially weightless condition without the effect of gravity comprising:

support means having a first continuously vertical axis;

positioner means coupled to the support means and having a vertical movement with respect to the support means and movement in a horizontal plane, the positioner means comprises cradle means including object attachment means, the object attachment means having pivoting means secured to the cradle means for providing rotation of the attachment means about a further axis;

counterbalancing means coupled to the positioner means to provide a substantially weightless condition to the positioner means with the object attached; and the positioner means including continuously horizontal linear motion guide means for providing horizontal movement of the object with respect to the support means, the positioner means including a second continuously vertical axis, means for pivotally mounting the object about the second continuously vertical axis, at least one of said continuously vertical axes being free to rotate as the positioner means is manually extended, the positioner means having an additional continuously horizontal axis for providing rotation of the object about said additional continuously horizontal axis whereby as the object is extended in the horizontal plane and rotated, the two vertical axes, the horizontal linear motion guide means, and the additional horizontal axis themselves support the weight of the positioner means with the cradle means and the attached object without the effect of gravity.

3. The system of claims 1 or 2 in which the positioner means includes additional means for mounting said positioner means on the support means, and means for rigidly connecting said additional mounting means to prevent relative vertical movement between said cradle means and the additional mounting means.

4. The system of claims 1 or 2 in which both the continuously horizontal guide means and the additional continuously horizontal axis are free of vertical movement with respect to each other.

5. The system of claims 1 or 2 in which at least the second continuously vertical axis, the horizontal guide means and the additional horizontal axis are all free of vertical movement among themselves.

6. The system of claims 1 or 2 in which positioner means includes means for mounting the positioner means on the support means and in which the second continuously vertical axis, the horizontal guide means and the additional horizontal axis are all free of vertical movement with respect to the mounting means.

7. The system of claims 1 or 2 in which the guide means includes means for providing only horizontal movement of the cradle means with respect to the support means.

8. The system of claim 3 in which said additional mounting means mounts said positioner means for sliding movement of the positioner means with respect to the support means.

9. The system of claim 3 in which the horizontal linear motion guide means includes two continuously horizontal members for providing the horizontal movement.

10. The system of claim 9 in which the second vertical axis, the horizontal linear motion guide means and the additional horizontal rotational axes are free of vertical movement with respect to the cradle means.

11. The system of claim 2 in which said positioner means is free to manually move vertically form a predetermind lowermost to a predetermined uppermost position free of mechanical restraints between the two positions.

12. The system of claims 1 or 2 in which said counterbalancing means includes a fluid cylinder and piston rod, one of which is rigidly fixed to the support means and the other supports the positioner assembly, means for setting the fluid pressure in the fluid cylinder to a predetermined value and for maintaining that value substantially constant for all vertical positions of the positioner means.

13. The system of claim 12 in which the support means includes velocity sensitive means for providing viscous damping for the positioner means.

14. The system of claim 1 in which said cradle means includes object attachment means having pivoting means secured to the cradle means for providing rotation of the attachment means about a further axis.

* * * * *